(12) United States Patent
Kaempf

(10) Patent No.: US 10,090,198 B2
(45) Date of Patent: Oct. 2, 2018

(54) METHOD FOR SEPARATING SUBSTRATES AND SEMICONDUCTOR CHIP

(71) Applicant: OSRAM Opto Semiconductors GmbH, Regensburg (DE)

(72) Inventor: Mathias Kaempf, Burglengenfeld (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 1 day.

(21) Appl. No.: 14/913,681

(22) PCT Filed: Aug. 6, 2014

(86) PCT No.: PCT/EP2014/066928
§ 371 (c)(1),
(2) Date: Feb. 22, 2016

(87) PCT Pub. No.: WO2015/024786
PCT Pub. Date: Feb. 26, 2015

(65) Prior Publication Data
US 2016/0204033 A1   Jul. 14, 2016

(30) Foreign Application Priority Data
Aug. 22, 2013 (DE) .......... 10 2013 109 079

(51) Int. Cl.
*H01L 21/00* (2006.01)
*H01L 23/544* (2006.01)
(Continued)

(52) U.S. Cl.
CPC .......... *H01L 21/78* (2013.01); *B23K 26/0006* (2013.01); *B23K 26/0057* (2013.01);
(Continued)

(58) Field of Classification Search
CPC ..... H01L 21/78; H01L 21/782; H01L 21/784; H01L 21/786; H01L 21/82;
(Continued)

(56) References Cited

U.S. PATENT DOCUMENTS

| 8,048,778 B1* | 11/2011 | Ku | .......... H01L 21/78 |
| | | | 257/E21.599 |
| 2004/0161907 A1* | 8/2004 | Goltl | .......... H01L 21/78 |
| | | | 438/460 |

(Continued)

FOREIGN PATENT DOCUMENTS

| DE | 102005061828 A1 | 1/2007 |
| DE | 10 2010 018 051 A1 | 10/2011 |

(Continued)

*Primary Examiner* — Fernando L Toledo
*Assistant Examiner* — Aaron Gray
(74) *Attorney, Agent, or Firm* — McDermott Will & Emery LLP

(57) ABSTRACT

Disclosed is a method for separating a substrate (1) along a separation pattern (4), in which method a substrate (1) is provided and an auxiliary layer (3) is applied to the substrate, said layer covering the substrate at least along the separation pattern. The substrate comprising the auxiliary layer is irradiated, such that the material of the auxiliary layer penetrates the substrate along the separation pattern in the form of an impurity. The substrate is broken along the separation pattern. A semiconductor chip (15) is also disclosed.

12 Claims, 2 Drawing Sheets

(51) Int. Cl.
*H01L 21/78* (2006.01)
*B23K 26/354* (2014.01)
*B23K 26/53* (2014.01)
*B23K 26/00* (2014.01)
*H01L 21/225* (2006.01)
*H01L 21/24* (2006.01)
*H01L 21/268* (2006.01)
*H01L 23/367* (2006.01)
*H01L 23/373* (2006.01)
*H01L 33/00* (2010.01)
*H01L 31/00* (2006.01)
*B23K 103/00* (2006.01)

(52) U.S. Cl.
CPC ........ *B23K 26/0081* (2013.01); *B23K 26/354* (2015.10); *B23K 26/53* (2015.10); *H01L 21/225* (2013.01); *H01L 21/24* (2013.01); *H01L 21/268* (2013.01); *H01L 23/3675* (2013.01); *H01L 23/3736* (2013.01); *H01L 31/00* (2013.01); *H01L 33/0095* (2013.01); *B23K 2203/30* (2015.10); *B23K 2203/56* (2015.10)

(58) Field of Classification Search
CPC ... H01L 21/8213; H01L 21/822; H01L 21/84; H01L 21/225; H01L 21/24; H01L 21/268; B23K 26/53; B23K 26/354
USPC ......... 257/620, E21.599; 438/462, 463, 460, 438/113
See application file for complete search history.

(56) References Cited

U.S. PATENT DOCUMENTS

| | | | |
|---|---|---|---|
| 2005/0029646 A1* | 2/2005 | Ueda | H01L 21/78 257/687 |
| 2007/0181891 A1 | 8/2007 | Eisert et al. | |
| 2008/0023456 A1 | 1/2008 | Watanabe | |
| 2010/0190280 A1* | 7/2010 | Horiuchi | H01L 21/6836 438/28 |
| 2013/0137220 A1* | 5/2013 | Matsubara | H01L 33/0079 438/121 |
| 2014/0080286 A1* | 3/2014 | Perzlmaier | H01L 21/78 438/462 |

FOREIGN PATENT DOCUMENTS

| | | |
|---|---|---|
| DE | 10 2011 017 097 A1 | 10/2012 |
| EP | 1 821 348 A2 | 8/2007 |
| EP | 1 906 438 A1 | 4/2008 |
| WO | WO 2012139953 A1 * 10/2012 | ............. H01L 21/78 |

\* cited by examiner

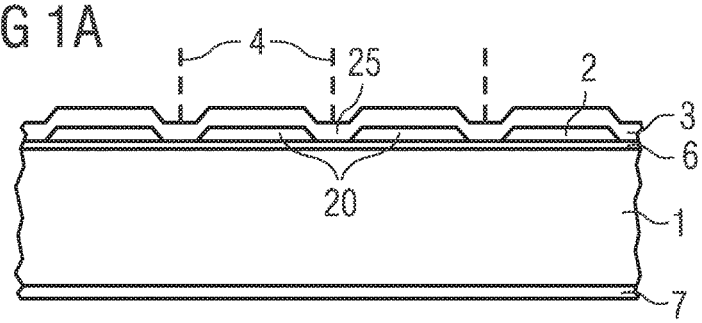
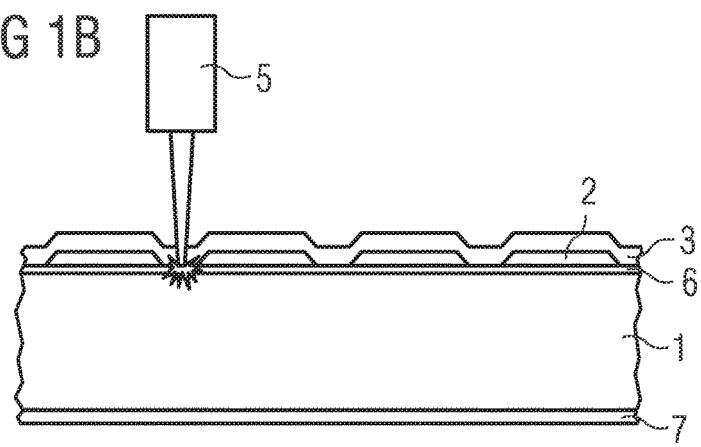
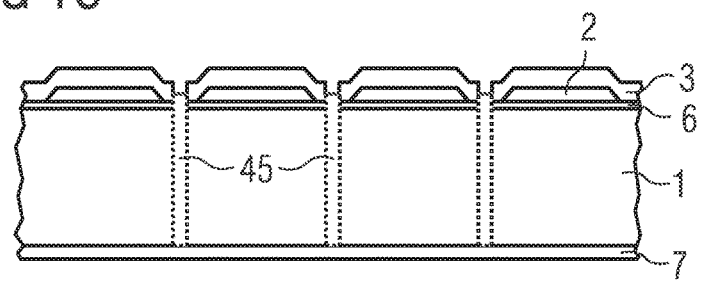
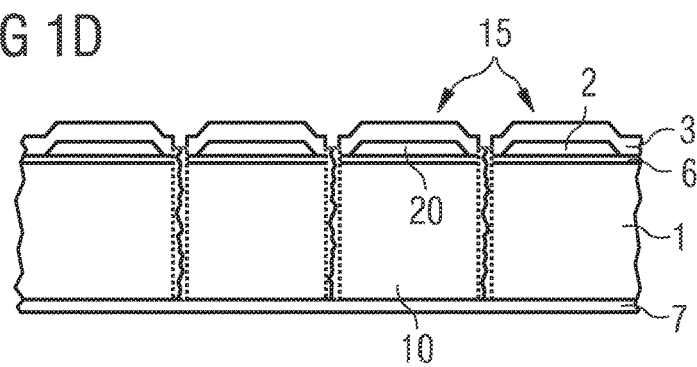

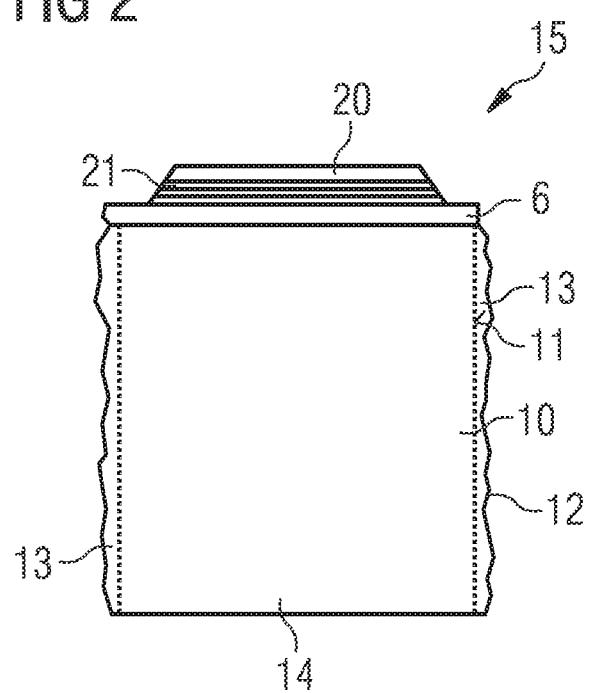

METHOD FOR SEPARATING SUBSTRATES AND SEMICONDUCTOR CHIP

The present application relates to a method for separating substrates and to a semiconductor chip.

When separating substrates in semiconductor technology, for example, laser separation processes take place, inter alia, in which the substrate material is removed. Depending on the material to be separated, however, such separation processes can be comparatively slow. In addition, comparatively wide separating streets have to be kept available, which reduces the usable area for components on the substrates.

One object is to specify a method for separating substrates which can be carried out simply, rapidly and cost-effectively. In addition, the intention is to specify a semiconductor chip which is distinguished by simple producibility.

These objects are achieved, inter alia, by means of a method and respectively a semiconductor chip according to the independent patent claims. The dependent patent claims relate to configurations and expediences.

A method for separating a substrate is specified. The separating takes place in particular along a separation pattern.

The geometry of the separation pattern is selectable within wide limits. By way of example, the separation pattern is embodied in a lattice-shaped fashion in a plan view of the substrate, such that polygonal, in particular rectangular, for example square, semiconductor chips are present after the substrate has been separated.

In accordance with at least one embodiment of the method, the method comprises a step in which an auxiliary layer is applied on the substrate. The auxiliary layer can be present in solid or liquid form. By way of example, the auxiliary layer is applied in liquid form and subsequently dried. The auxiliary layer covers the substrate at least regionally along the separation pattern, in particular along the entire separation pattern. By way of example, the auxiliary layer is applied over the whole area or over substantially the whole area, for instance with an area coverage of at least 90%, on the substrate.

In accordance with at least one embodiment of the method, the method comprises a step in which the substrate with the auxiliary layer is irradiated, such that material of the auxiliary layer penetrates into the substrate as an impurity along the separation pattern. At the time of irradiation, the auxiliary layer can be present in solid or liquid form. The solid form is particularly suitable on account of the better handlability. The impurity can extend through the substrate in a vertical direction, that is to say perpendicularly to a main extension plane of the substrate, completely or only regionally.

In accordance with at least one embodiment of the method, the method comprises a step in which the substrate is broken along the separation pattern. The term "breaking" encompasses any type of mechanical loading of the substrate which results in the substrate being divided at least regionally. The process of breaking the substrate is expediently carried out after the irradiation.

In at least one embodiment of a method for separating a substrate along a separation pattern, a substrate is provided. An auxiliary layer is applied on the substrate, said auxiliary layer covering the substrate at least along the separation pattern. The substrate with the auxiliary layer is irradiated, such that material of the auxiliary layer penetrates into the substrate as an impurity along the separation pattern. The substrate is broken along the separation pattern.

As a result of the irradiation, therefore, material of the auxiliary layer can penetrate into the substrate and bring about there a regional modification of the material of the substrate. "Modification" means, in particular, that the material of the substrate in the irradiated regions, in particular on account of the material that has penetrated therein, at least with regard to one physical variable or material property, has a different constitution than before the irradiation and/or a different constitution than in a non-irradiated region.

In particular, the modification of the material of the substrate is delimited in a lateral direction spatially to regions into which energy is introduced during the irradiation, for example by a laser beam. After the irradiation, however, the impurities in the substrate along the separation pattern are present in a higher concentration, for example in a concentration at least twice as high, compared with between adjacent streets of the separation pattern.

The substances which bring about the modification of the substrate are initially present in the auxiliary layer as substance capable of modification during the irradiation. In contrast to material present in gaseous form, a liquid or solid layer comprising substances capable of modification is dispelled less easily during the irradiation, for example by sublimated, expelled substrate material or by a plasma jet above the substrate that arises locally during the irradiation. In other words, the substances capable of modification which are present in the auxiliary layer ensure that these substances are present in a sufficient concentration at the location and at the point in time of the irradiation.

As a result of the impurities, a modified region arises in the substrate along the separation pattern. The modified region forms, in particular, a predetermined breaking location region at which the breaking of the substrate is effected. A transverse extent of the modified region, that is to say an extent of the modified region between adjacent semiconductor bodies, is adjustable during the irradiation in particular by means of the beam diameter.

In accordance with at least one embodiment of the method, the impurity embrittles the substrate along the separation pattern. As a result of the irradiation of the substrate, therefore, along the separation pattern regions arise in which the substrate is brittler than between these two adjacent irradiated regions.

In accordance with at least one embodiment of the method, the material of the auxiliary layer is diffused into the substrate during the process of irradiating the substrate.

Alternatively or supplementarily, during the process of irradiating, the substrate can melt locally and the material of the auxiliary layer can be alloyed therein. The solidified material of the substrate therefore also contains material of the auxiliary layer as an impurity in addition to the original material of the substrate. Without the auxiliary layer, by contrast, the material solidifying after irradiation would have substantially the same properties as before irradiation, with the result that targeted breaking of the substrate along the separation pattern would not readily be achievable.

In accordance with at least one embodiment of the method, the substrate is metallic. By way of example, the substrate consists of a metal or a metallic alloy. For example, the substrate contains molybdenum or consists of molybdenum. It has been found that by means of the irradiation of the substrate with the previously applied auxiliary layer even in the case of metallic substrates, which thus have a comparatively high thermal conductivity and typically also a high melting point, a targeted local modification of the substrate can be achieved, with the result that the substrate breaks during a mechanical loading along the separation pattern.

In accordance with at least one embodiment of the method, the auxiliary layer contains a substance capable of modification. In principle, any material or any material composition which brings about a modification of the substrate material to be separated, for example with regard to its brittleness, is suitable as substance capable of modification. The substance capable of modification is present, in particular, in a carrier medium. By way of example, a polymer material, for instance polyvinyl acetate (PVA), is suitable as carrier medium.

In accordance with at least one embodiment of the method, the auxiliary layer contains an amide, for example a carboxamide. In particular, urea is suitable on account of the comparatively high nitrogen proportion of approximately 47%. By way of example, the amide is present in the auxiliary layer as substance capable of modification in the carrier medium.

In accordance with at least one embodiment of the method, the auxiliary layer is applied to the substrate over the whole area. In other words, no structuring of the auxiliary layer is required. Alternatively, however, it is conceivable for the auxiliary layer to be present only regionally, in particular only in the region along the separation pattern, during the irradiation.

In accordance with at least one embodiment of the method, nitrogen is introduced into the substrate as the impurity along the separation pattern. Nitrogen as impurity, even in very small concentrations, brings about an embrittlement of the substrate material, particularly in the case of a metallic substrate such as a molybdenum substrate. The nitrogen can be provided for example by a nitrogen-containing substance capable of modification in the auxiliary layer, for example by an amide.

By way of example, the concentration of the impurity in the modified regions is at least in places between 1/100 000% and 1/1000% inclusive, for example 1/10 000%.

In accordance with at least one embodiment of the method, the irradiation is carried out by means of a laser in pulsed operation. The pulse duration is in the nanoseconds range or in the picoseconds range, for example. By way of example, the pulse duration is between 1 ps and 100 ns inclusive.

In accordance with one embodiment, a semiconductor chip comprises a semiconductor body and a metallic substrate body, on which the semiconductor body is arranged. A side surface of the metallic substrate body has a breaking edge. In other words, the side surface exhibits the irregular structures typical of mechanical breaking.

In the case of a semiconductor chip comprising a metallic substrate body, the waste heat generated in the semiconductor body during the operation of the semiconductor chip can be efficiently dissipated via the metallic substrate body.

The semiconductor chip is embodied for example as an optoelectronic semiconductor chip having an active region provided for generating and/or receiving radiation. The semiconductor body, in particular the active region, comprises a compound semiconductor material, for example.

In one configuration of the semiconductor chip, the substrate body has, in an edge region adjoining the side surface, a concentration of an impurity that is at least twice, preferably at least five times as high, as that in a region spaced apart from the side surface, for example in a plan view of the semiconductor chip in the region of the center of gravity of the semiconductor chip. During the production of the semiconductor chip, the substrate from which the substrate body emerges is therefore broken along those regions in which the impurity is increased.

In one configuration, the impurity is nitrogen. Nitrogen brings about an intensification of the embrittlement in the case of metallic substrates even at very low concentrations.

In one configuration, the substrate body contains molybdenum or consists of molybdenum. Molybdenum is also suitable, in particular, on account of the coefficient of thermal expansion similar to that of semiconductor material. However, a different material may also be employed, in particular a different metal or a metallic alloy, for the substrate and thus for the substrate body.

The substrate body preferably emerges from a substrate which is separated in accordance with the method described above. Features mentioned in association with the method can therefore also be used for the semiconductor chip, and vice versa.

Further features, configurations and expediencies will become apparent from the following description of the exemplary embodiments in association with the figures.

In the figures:

FIGS. 1A to 1D show one exemplary embodiment of a method for separating a substrate on the basis of intermediate steps illustrated in each case in schematic sectional view; and FIG. 2 shows one exemplary embodiment of a semiconductor chip.

Elements that are identical, of identical type or act identically are provided with the same reference signs in the figures.

The figures and the size relationships of the elements illustrated in the figures among one another should not be regarded as true to scale. Rather, individual elements and in particular layer thicknesses may be illustrated with exaggerated size in order to enable better illustration and/or in order to afford a better understanding.

An excerpt from a substrate 1 on which a semiconductor layer sequence 2 is arranged is shown by way of example in the case of the exemplary embodiment illustrated in FIGS. 1A to 1D. The semiconductor layer sequence 2 is fixed to the substrate by a connection layer 6, for example a solder layer or an electrically conductive adhesive layer.

The semiconductor chips to be produced can be for example optoelectronic semiconductor chips, for instance LED semiconductor chips.

The semiconductor layer sequence 2 is subdivided into a plurality of semiconductor bodies 20 by means of mesa trenches 25, wherein each semiconductor body is provided respectively for one semiconductor chip. The substrate 1 is singulated along a separation pattern 4, which runs along the mesa trenches 25 in a plan view of the substrate. In a plan view of the substrate, the separation pattern runs for example in a lattice-shaped fashion, for example with first separation streets running parallel to one another and second separation streets running perpendicularly thereto, such that in plan view rectangular, for example square, semiconductor chips arise during singulation. However, the described method for separating the substrate is also suitable for other, in particular polygonal, for example rhombic, geometries of the semiconductor chips to be produced.

The substrate is arranged on an auxiliary carrier 7, for example a film. However, a rigid auxiliary carrier can also be employed. A device in which the substrate is fixed by means of reduced pressure or by means of electrostatic forces is also suitable as auxiliary carrier.

An auxiliary layer 3 is applied on that side of the substrate which faces away from the auxiliary carrier. The auxiliary layer can be present as solid or liquid matter. The layer can be applied in liquid form or from the gas phase and subsequently be dried out. Alternatively, the layer can remain in the liquid state. The layer is for example a layer comprising a carrier medium, for example PVA, which is admixed with a substance capable of modification for the substrate material to be separated, for example molybdenum. By way of example, an amide, for instance a carboxamide, for example urea, is suitable as substance capable of modification.

Alternatively or supplementarily to molybdenum, however, the substrate can also contain a different metal or a metallic alloy. By way of example, the substrate can contain one or a plurality of the metals from the group consisting of molybdenum, copper and tungsten.

On the side facing away from the semiconductor layer sequence, the substrate can be provided with a contact layer (not illustrated explicitly). Such a contact layer can be provided for example for improving the solderability of the semiconductor chips to be produced. The material for the substrate is thus selectable independently of its solderability. By way of example, the contact layer can contain gold or tin or a metallic alloy comprising at least one of the materials mentioned. The contact layer can be formed over the whole area on the substrate or can already be subdivided into individual contact areas for the semiconductor chips to be produced. The thickness of the contact layer is preferably less than the thickness of the substrate. By way of example, the thickness of the contact layer is at most 10% of the thickness of the substrate.

Afterward, as illustrated in FIG. 1B, the substrate is irradiated by a laser 5 from the side on which the auxiliary layer 3 is applied. The irradiation is carried out sequentially along the separation pattern 4. As a result of the irradiation, material of the substrate is partly sublimated at the impingement point of the radiation. Another part merely melts on account of the comparatively high thermal conductivity and solidifies again. Material of the auxiliary layer 3 penetrates into the molten material, with the result that the solidified material of the substrate 1 has modified regions 45 in which material of the auxiliary layer 3 is present as an impurity (FIG. 1C). These modified regions form predetermined breaking locations for subsequently subjecting the substrate to mechanical loading. A suitable laser is, for example, a laser in pulsed operation, in particular having a pulse duration in the picoseconds or nanoseconds range. Comparatively narrow separation streets can be obtained using such a laser. In principle, however, a laser in continuous wave operation can also be employed.

In the case of an amide as substance capable of modification, the nitrogen thus introduced into the substrate 1 brings about a great embrittlement even at very low concentrations of 1/10 000%, for example, with the result that the modified regions 45 constitute predetermined breaking locations. In the modified regions, the concentration is preferably between 1/100 000% and 1/1000% inclusive.

The material of the substrate 1 need not necessarily melt during the radiation. Alternatively, during the irradiation the material of the auxiliary layer 3 can also penetrate locally on account of diffusion into the substrate 1 and thus form the modified regions 45.

Without the introduced impurity, molybdenum, for example, would predominantly solidify as pure molybdenum after an irradiation and, as resolidified material of the substrate, would have the same or at least substantially the same modulus of elasticity as before the irradiation. In particular, the modulus of elasticity would be too high to achieve targeted breaking at a predefined location reliably and reproducibly.

The modified regions 45 need not extend completely through the substrate 1 in a vertical direction, as long as the vertical extent of the modified regions is large enough in comparison with the thickness of the substrate that the modified regions act as predetermined breaking locations during breaking and the substrate ruptures during mechanical loading along said predetermined breaking locations.

Preferably, the vertical extent of the modified regions is at least 50% of the thickness of the substrate.

During the irradiation, the substance capable of modification is not gaseous, but rather is bound in the carrier medium and is therefore available uniformly along a feed direction of the laser. The risk of displacement of the substance, for example on account of a plasma jet induced by the laser or on account of material expelled from the substrate, is thus avoided. In comparison with a substance capable of modification that is present in gaseous form, introduction of the material into the substrate in a manner homogeneous along the separation pattern is thus simplified.

The energy introduced by the laser therefore need not be so high that the material along the separation pattern almost completely sublimates. As a result, the lateral extent of the irradiation transversely with respect to the feed direction, that is to say for example the beam diameter of the laser at the impingement point on the substrate, can be comparatively narrow. By way of example, the beam diameter is between 2 μm and 25 μm inclusive. The full width at half maximum (FWHM) can be used as a measure of the beam diameter in case of doubt. On account of the narrow separation streets thus obtainable, the packing density of the semiconductor chips 15 on the substrate 1 can be increased, as a result of which the production costs can be reduced.

The irradiation can be carried out in ambient air, as a result of which production is simplified. However, it is also conceivable for the irradiation to be carried out in a gas atmosphere comprising a process gas which fosters the local material modification in addition to the auxiliary layer 3. By way of example, the irradiation can be carried out in a nitrogen atmosphere.

After the irradiation, the substrate 1 is mechanically loaded in such a way that the substrate 1 and a continuous contact layer possibly present break along the separation streets of the separation pattern 4. By way of example, a wedge breaking method is suitable for this purpose. In this case, the breaking edges 12 run within the modified regions 45 in a plan view of the substrate.

After breaking, the singulated semiconductor chips 15 are present in a manner spatially separated from one another in geometrical order on the auxiliary carrier 7. The further processing of the singulated semiconductor chips is thereby simplified.

The residues of the auxiliary layer 3 that remained on the substrate after the irradiation can be removed before or after singulation, with the result that the completed semiconductor chips are free of the auxiliary layer (FIG. 2). In a departure therefrom, it is also conceivable for the auxiliary layer 3 to remain on the completed semiconductor chips 15.

One exemplary embodiment of a semiconductor chip is shown schematically in sectional view in FIG. 2.

The semiconductor chip 15 comprises a semiconductor body 20, which is fixed to a substrate body 10 by means of a connection layer 6. A side surface 11 of the substrate body 10 has a breaking edge 12. The singulation of the semiconductor chip is therefore carried out by mechanical breaking of the, in particular metallic, substrate body 10. In an edge region 13 adjoining the side surface 11, the substrate body 10 has an impurity. In particular, the impurity is higher than in a region 14 of the substrate 1 which is spaced apart laterally from the side surface. By way of example, the concentration in the edge region is at least twice as high, preferably at least ten times as high, most preferably at least 100 times as high, as in the region 14 spaced apart from the side surface, for example at the center of gravity of the semiconductor chip.

The semiconductor chip 15 is embodied by way of example as a thin-film LED semiconductor chip in which a growth substrate for the semiconductor layer sequence 2 of the semiconductor body is removed. The substrate body 10 serves for mechanically stabilizing the semiconductor body, such that the growth substrate is no longer required for this purpose.

The semiconductor body 20, in particular an active region 21 provided for generating radiation, preferably contains a III-V compound semiconductor material.

III-V compound semiconductor materials are particularly suitable for generating radiation in the ultraviolet ($Al_xIn_yGa_{1-x-y}N$) through the visible ($Al_xIn_yGa_{1-x-y}N$, in particular for blue to green radiation, or $Al_xIn_yGa_{1-x-y}P$, in particular for yellow to red radiation) to the infrared ($Al_xIn_yGa_{1-x-y}As$) spectral range. Here in each case $0 \leq x \leq 1$, $0 \leq y \leq 1$ and $x+y \leq 1$, hold true, in particular where $x \neq 1$, $y \neq 1$, $x \neq 0$ and/or $y \neq 0$. With III-V compound semiconductor materials, in particular from the material systems mentioned, high internal quantum efficiencies can furthermore be obtained in the generation of radiation.

Heat loss that arises in the semiconductor body 20 during the operation of the semiconductor chip 15 can be efficiently dissipated via the substrate body 10. Molybdenum has a thermal conductivity of 138 W/(m*K), for example.

At the same time, the production of such a semiconductor chip comprising a substrate body which emerges from a substrate by means of breaking is comparatively expedient.

This patent application claims the priority of German patent application 10 2013 109 079.6, the disclosure content of which is hereby incorporated by reference.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or the exemplary embodiments.

The invention claimed is:

1. A method for separating a substrate along a separation pattern, comprising the following steps:
    a) providing the substrate;
    b) applying an auxiliary layer, which covers the substrate at least along the separation pattern;
    c) irradiating, via a laser beam, the substrate with the auxiliary layer, such that material of the auxiliary layer penetrates into the substrate as an impurity along the separation pattern; and
    d) breaking, using a wedge breaking method, the substrate along the separation pattern, wherein the breaking comprises a mechanical loading of the substrate.

2. The method according to claim 1, wherein the impurity embrittles the substrate along the separation pattern.

3. The method according to claim 1, wherein material of the auxiliary layer indiffuses into the substrate in step c).

4. The method according to claim 1, wherein in step c) the substrate melts locally and material of the auxiliary layer is alloyed therein.

5. The method according to claim 1, wherein the substrate is metallic.

6. The method according to claim 1, wherein the auxiliary layer contains an amide.

7. The method according to claim 1, wherein the auxiliary layer contains urea.

8. The method according to claim 1, wherein the auxiliary layer is applied to the substrate over the whole area in step b).

9. The method according to claim 1, wherein nitrogen is introduced into the substrate as the impurity along the separation pattern.

10. The method according to claim 1, wherein the irradiation in step c) is carried out by means of the laser beam in pulsed operation or in continuous wave operation.

11. A semiconductor chip comprising:
    a semiconductor body; and
    a metallic substrate body, on which the semiconductor body is arranged,
    wherein a side surface of the metallic substrate body has a mechanical breaking edge,
    wherein the substrate body has, in an edge region adjoining the side surface, a concentration of an impurity that is at least twice as high as that in a region spaced apart from the side surface,
    wherein the semiconductor body is fixed to the metallic substrate body via a connection layer,
    wherein the connection layer comprises a solder or a conductive adhesive, and
    wherein the metallic substrate body is completely metallic on a side of the connection layer facing away from the semiconductor body.

12. A method for separating a substrate along a separation pattern, comprising the following steps:
    a) providing the substrate;
    b) applying an auxiliary layer, which covers the substrate at least along the separation pattern;
    c) irradiating, via a laser beam, the substrate with the auxiliary layer, such that material of the auxiliary layer penetrates into the substrate as an impurity along the separation pattern, wherein the substrate is made from a metallic material, and the impurity penetrates into the metallic material of the substrate; and
    d) breaking the substrate along the separation pattern, wherein the breaking comprises a mechanical loading of the substrate.

* * * * *